(12) United States Patent
Wu et al.

(10) Patent No.: US 11,406,022 B2
(45) Date of Patent: Aug. 2, 2022

(54) SUBSTRATE HAVING THROUGH VIA AND METHOD OF FABRICATING THE SAME

(71) Applicant: Industrial Technology Research Institute, Hsinchu (TW)

(72) Inventors: Chih-I Wu, Taipei (TW); Shih-Ming Lin, Chiayi County (TW); Pin-Hao Hu, Kaohsiung (TW); Yu-Chung Lin, Tainan (TW); Hsin-Yu Chang, Tainan (TW); Fu-Lung Chou, Tainan (TW); Chien-Jung Huang, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 17/134,132

(22) Filed: Dec. 24, 2020

(65) Prior Publication Data

US 2022/0141961 A1 May 5, 2022

(30) Foreign Application Priority Data

Nov. 3, 2020 (TW) .................... 109138203

(51) Int. Cl.
| | |
|---|---|
| *H05K 1/11* | (2006.01) |
| *H05K 3/00* | (2006.01) |
| *H05K 3/42* | (2006.01) |
| *H01L 23/498* | (2006.01) |

(52) U.S. Cl.
CPC ............. *H05K 3/002* (2013.01); *H05K 1/116* (2013.01); *H05K 3/0029* (2013.01); *H05K 3/0035* (2013.01); *H01L 23/49827* (2013.01); *H05K 3/423* (2013.01); *H05K 2201/09545* (2013.01); *H05K 2201/09827* (2013.01); *H05K 2201/09863* (2013.01)

(58) Field of Classification Search
CPC .... H05K 1/111–113; H05K 1/114–115; H05K 3/0035; H05K 3/0029
See application file for complete search history.

(56) References Cited

U.S. PATENT DOCUMENTS

| | | | |
|---|---|---|---|
| 7,535,106 B2 | 5/2009 | Shiono et al. | |
| 10,256,176 B2 * | 4/2019 | Kuramochi | ............. H01L 25/18 |
| 10,292,275 B2 | 5/2019 | Isobe | |
| 2020/0118931 A1 | 4/2020 | Garner et al. | |

FOREIGN PATENT DOCUMENTS

| | | |
|---|---|---|
| CN | 105280798 | 1/2016 |
| CN | 110010484 | 7/2019 |
| TW | I513386 | 12/2015 |
| TW | 202002339 | 1/2020 |

OTHER PUBLICATIONS

Office Action of Taiwan Counterpart Application, dated Apr. 30, 2021, pp. 1-7.

* cited by examiner

*Primary Examiner* — Jeremy C Norris
(74) *Attorney, Agent, or Firm* — JCIPRNET (57) ABSTRACT

A method of fabricating a substrate having a through via includes: providing a carrier board having a release layer thereon; attaching the substrate onto the carrier board via the release layer; applying a light beam to the substrate to form a first blind hole in the substrate, wherein the first blind hole penetrates a first surface and a second surface of the substrate; performing an enlargement process on the first blind hole to form a second blind hole; forming a through via in the second blind hole; and performing a de-bonding process to release the substrate having a through via from the carrier board.

12 Claims, 10 Drawing Sheets

SUBSTRATE HAVING THROUGH VIA AND METHOD OF FABRICATING THE SAME

CROSS-REFERENCE TO RELATED APPLICATION

This application claims the priority benefit of Taiwanese application serial no. 109138203, filed on Nov. 3, 2020. The entirety of the above-mentioned patent application is hereby incorporated by reference herein and made a part of this specification.

TECHNICAL FIELD

The embodiments of the disclosure relate to a substrate and a method of fabricating the same, and particularly relate to a substrate having a through via and a method of fabricating the same.

BACKGROUND

A through glass via (TGV) functional substrate is a substrate for which a through via process and a through via metallization process are performed on a glass substrate to meet the requirements of device design and production. The through via glass functional substrate has a wide range of applications, such as RF integrated passive devices or micro-light-emitting diode (μLED) displays. The current method is to form a blind hole on a thick glass, then perform a metallization process, and lastly form a through via by thinning via chemical mechanical polishing. However, the chemical mechanical polishing of glass requires a longer process time and consumes many polishing consumables.

SUMMARY

The disclosure provides a substrate having a through via with good quality.

The disclosure provides a method of fabricating a substrate having a through via that may reduce the risk of substrate cracking, accelerate the process, and reduce material consumption.

A method of fabricating a substrate having a through via of the disclosure includes: providing a carrier board having a release layer thereon; attaching the substrate onto the carrier board via the release layer; applying a high-energy light beam to the substrate to form a first blind hole in the substrate, wherein the first blind hole penetrates a first surface and a second surface of the substrate; performing an enlargement process on the first blind hole to form a second blind hole; forming a through via in the second blind hole; and performing a de-bonding process to release the substrate having the through via from the carrier board.

A substrate having a through via of the disclosure includes: a substrate; and a through via located in the substrate, wherein a height of the through via is greater than a thickness of the substrate, and there is a minimum width between a top surface and a bottom surface of the through via.

The substrate having a through via and the method of fabricating the same according to the embodiments of the disclosure may fabricate a through via having good quality, reduce the risk of substrate cracking, accelerate the process, and reduce material consumption.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
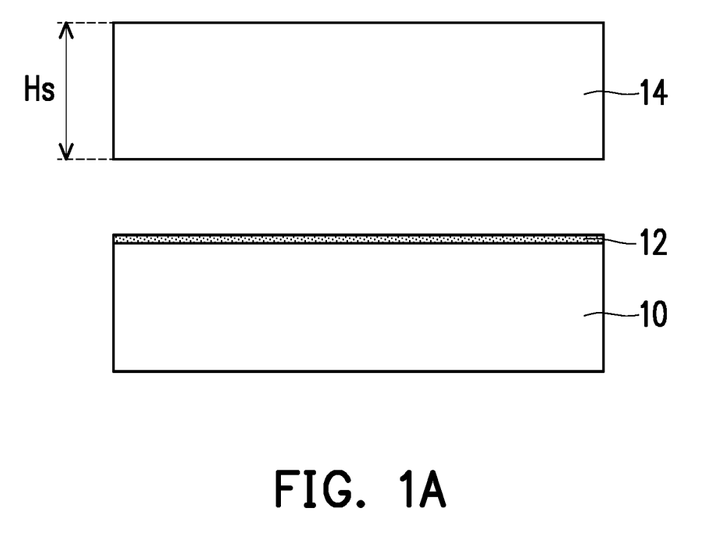
FIG. 1A to FIG. 1H are cross-sectional views of a manufacturing process of a substrate having a through via according to an embodiment of the disclosure.

Referring to FIG. 1A, a carrier board 10 and a substrate 14 are provided. The carrier board 10 may be a blank glass carrier board, a blank ceramic carrier board, a semiconductor carrier board (such as a silicon wafer substrate), a plastic carrier board, or the like. A release layer 12 is formed on the carrier board 10. The release layer 12 may be formed by an adhesive such as ultraviolet (UV) adhesive, light-to-heat conversion (LTHC) adhesive, etc., but other types of adhesives may also be used. In some embodiments, the release layer 12 may be decomposed under the heat of light, so that the carrier board 10 may be separated from the structure formed thereon.

The substrate 14 may be a glass substrate, a quartz substrate, a ceramic substrate (for example, silicon oxide, aluminum oxide, zinc oxide, zirconium oxide, magnesium oxide, or a mixture of these ceramic materials, etc.) The substrate 14 is a thin substrate, and a thickness Hs thereof is, for example, 20 μm to 200 μm. The thickness variation of the substrate 14 is less than 5 μm.

Figure 1B:
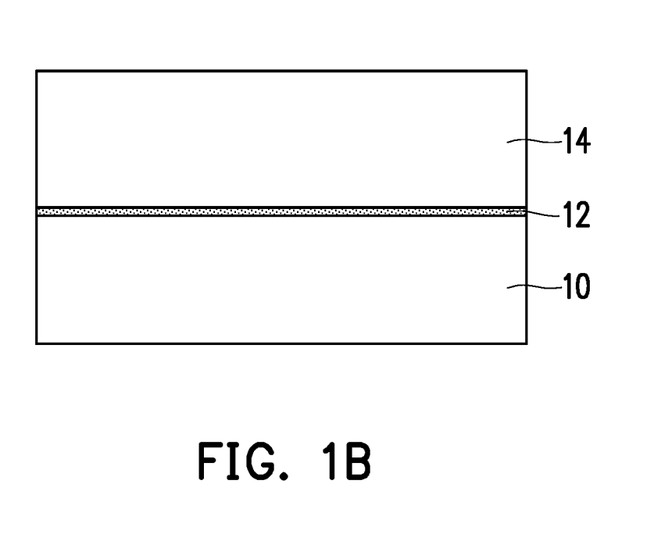

Referring to FIG. 1B, a lower surface 14$b$ of one or a plurality of substrates 14 is attached onto the carrier board 10 via the release layer 12. The lower surface 14$b$ and an upper surface 14$a$ of the substrate 14 are opposite to each other. The upper surface 14$a$ and the lower surface 14$b$ may be referred to as the first surface 14$a$ and the second surface 14$b$, respectively.

Figure 1C:
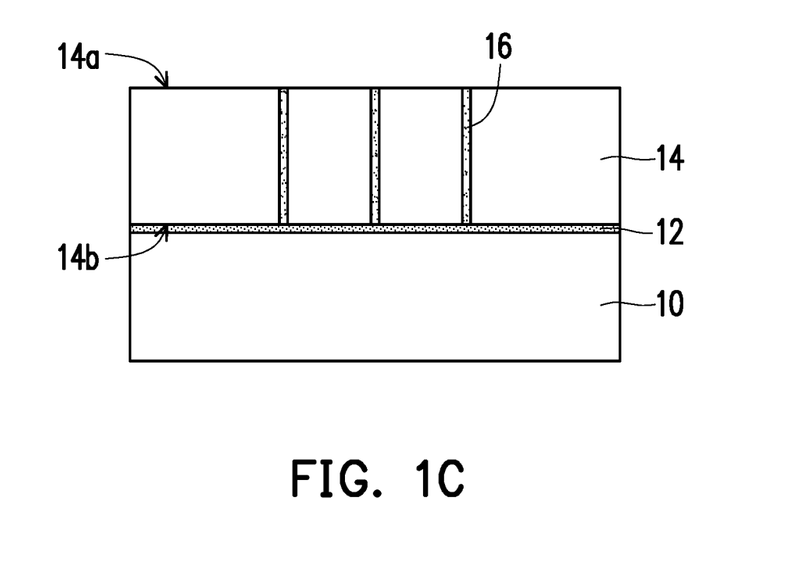

Referring to FIG. 1C, a drilling process is performed to form a blind hole 16 in the substrate 14. The blind hole 16 penetrates the upper surface 14$a$ and the lower surface 14$b$ of the substrate 14. The width of the blind hole 16 is, for example, between 1 μm and 5 μm. The drilling process may be performed by a light beam, such as a high-energy light beam. The high-energy light beam here refers to a light beam having an energy between 0.1 nJ and 100 nJ. The light beam may be infrared, visible, or ultraviolet laser. In some embodiments of the drilling process using a laser, via the design of a lens group, energy may be quickly attenuated after focusing, thereby controlling the depth of the laser drilling. The release layer 12 may be used as a buffer layer in the process, so that the laser range is limited to the areas of the substrate 14 and the release layer 12 without damaging the carrier board 10. Therefore, loss of the carrier board 10 may be reduced.

Figure 1D:
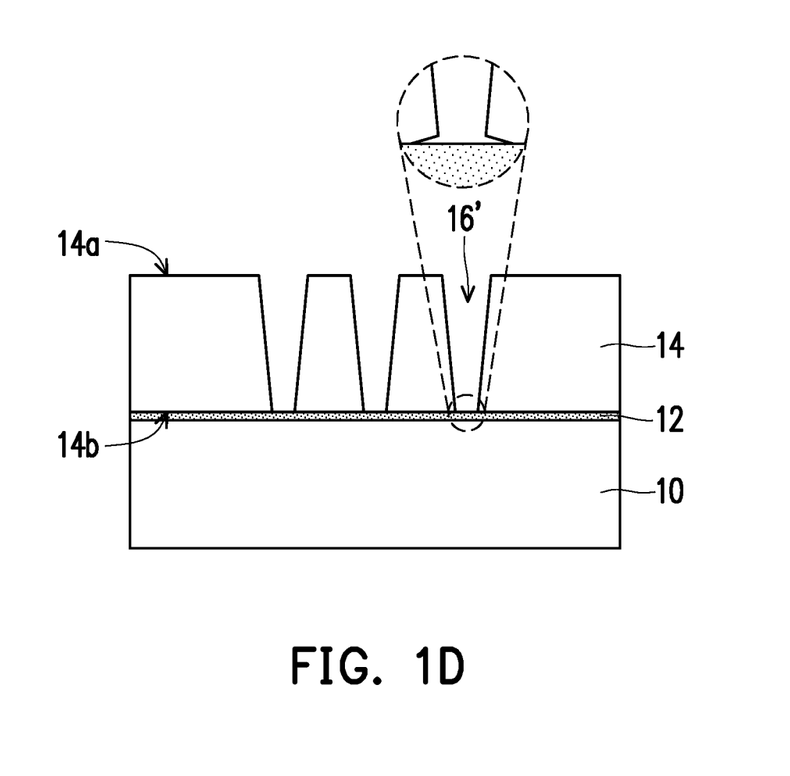

Referring to FIG. 1D, an enlargement process is performed to increase the width of the blind hole 16 to form a hole 16'. The enlargement process may be implemented by an etching process. The etching process may be an isotropic etching process, for example, a wet etching process. In an embodiment where the substrate 14 is glass, a hydrofluoric acid solution may be used as an etchant to perform the enlargement process. The hole 16' may have vertical sidewalls or inclined sidewalls. In some embodiments, the hole 16' has a tapered shape. The width of the resulting hole 16' is gradually decreased from the upper surface 14a of the substrate 14 toward the lower surface 14b of the substrate 14. In some other embodiments, during the enlargement process, the etchant remaining on the release layer 12 at the bottom portion of the blind hole 16 penetrates between the release layer 12 and the substrate 14 laterally along the bottom surface of the blind hole 16. As a result, the resulting hole 16' has an asymmetric hourglass shape. The width of the hole 16' is gradually decreased from the upper surface 14a of the substrate 14 toward the lower surface 14b of the substrate 14. However, near the bottom portion of the hole 16', the width of the hole 16' is gradually increased toward the direction of the lower surface 14b of the substrate 14.

Figure 1E:
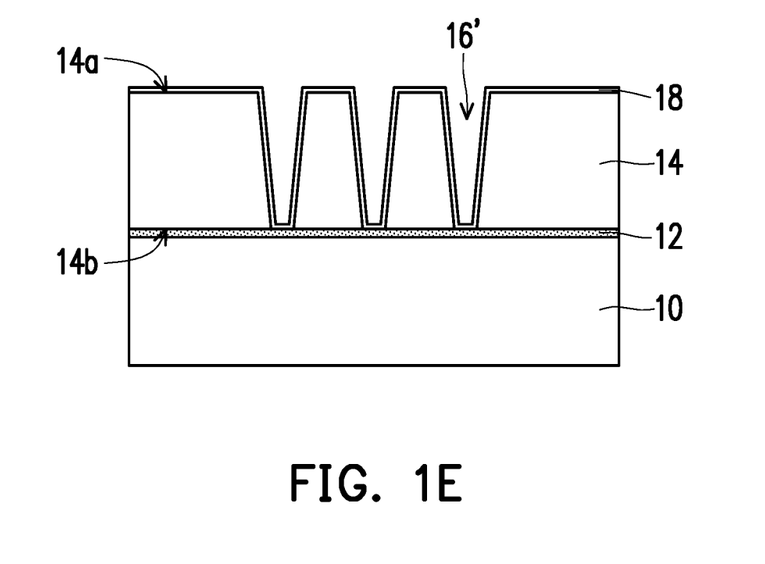

Referring to FIG. 1E, a seed material layer 18 is formed on the upper surface 14a of the substrate 14 and on the sidewalls and the bottom surface of the hole 16'. The seed material layer 18 may be a single layer or a plurality of layers. The seed material layer 18 may contain a copper-based material (for example, copper, titanium-copper alloy, etc.), but other materials (for example, nickel, gold) may also be used as another option. In some embodiments, the seed material layer 18 includes a titanium nitride layer and a copper layer. The seed material layer 18 may be formed by a physical vapor deposition method (for example, a sputtering method) or a chemical vapor deposition method.

Figure 1F:
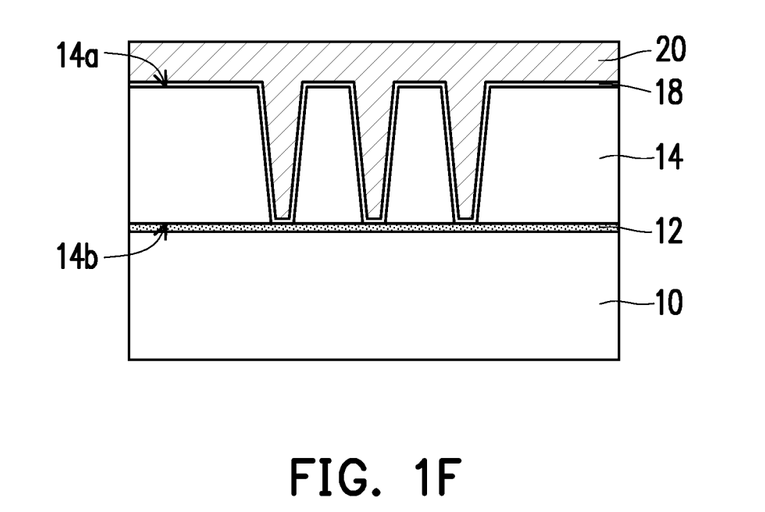

Referring to FIG. 1F, a conductive material layer 20 is formed on the surface of the substrate 14 and in the hole 16'. The conductive material layer 20 includes a copper layer. The conductive material layer 20 may contain a copper-based material (for example, copper, copper-based alloy, etc.), but as another option, another suitable material, such as nickel, titanium, aluminum, etc., may also be used. The conductive material layer 20 may be formed on the seed material layer 18 by an electroplating method. However, as another option, any suitable alternative process may be used to form the conductive material layer 20. In some embodiments, the seed material layer 18 and the conductive material layer 20 together completely fill the hole 16'.

Figure 1G:
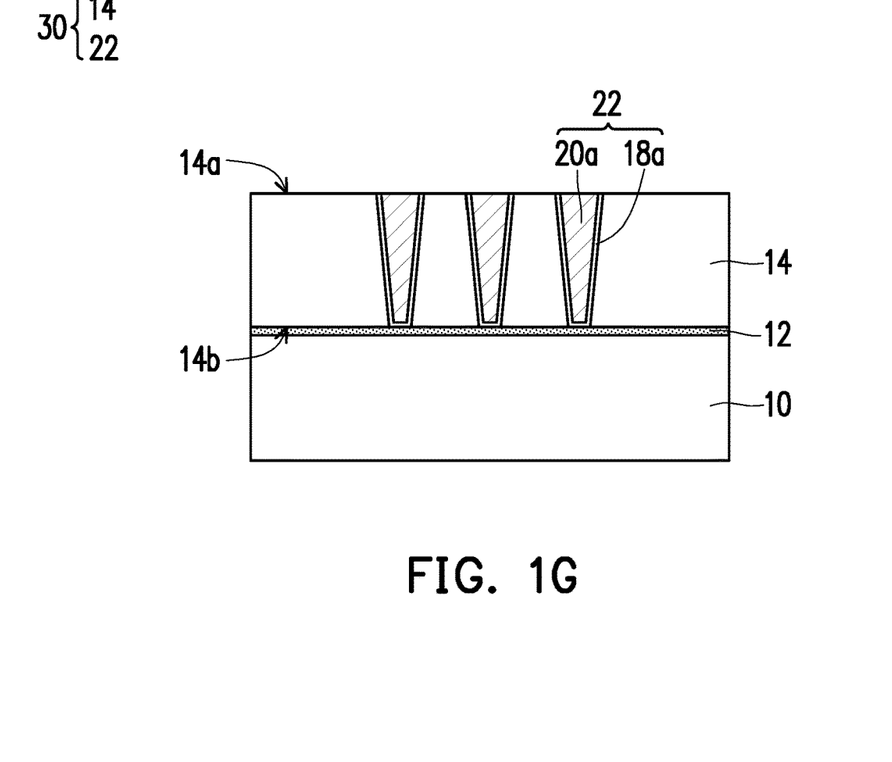

Referring to FIG. 1G, the conductive material layer 20 and the seed material layer 18 on the upper surface 14a of the substrate 14 are removed to form a conductive layer 20a and a seed layer 18a in the hole 16'. The conductive layer 20a and the seed layer 18a together form a through via 22. The method of removing the conductive material layer 20 and the seed material layer 18 on the surface of the substrate 14 may be a chemical mechanical polishing method (CMP).

Figure 1H:
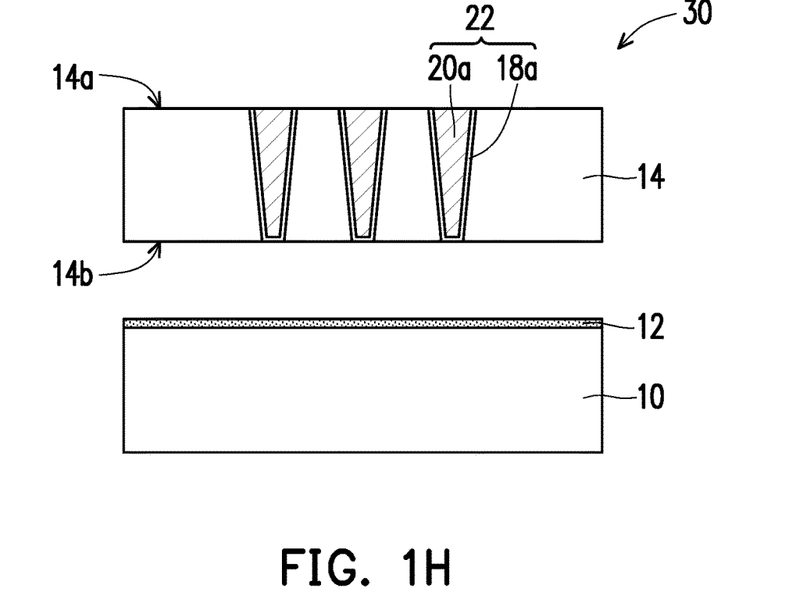

Referring to FIG. 1H, a de-bonding process is performed to separate a substrate 30 having a through via from the carrier board 10. In some embodiments, the carrier board 10 having the substrate 14 is turned over, and the release layer 12 is irradiated with light (for example, laser light or ultraviolet light), so that the release layer 12 is decomposed under the heat of the light. Then, the carrier board 10 is separated from the lower surface 14b of the substrate 14. At this point, the substrate 30 having a through via is formed. The carrier board 10 may be recycled for use.

Figure 2A:
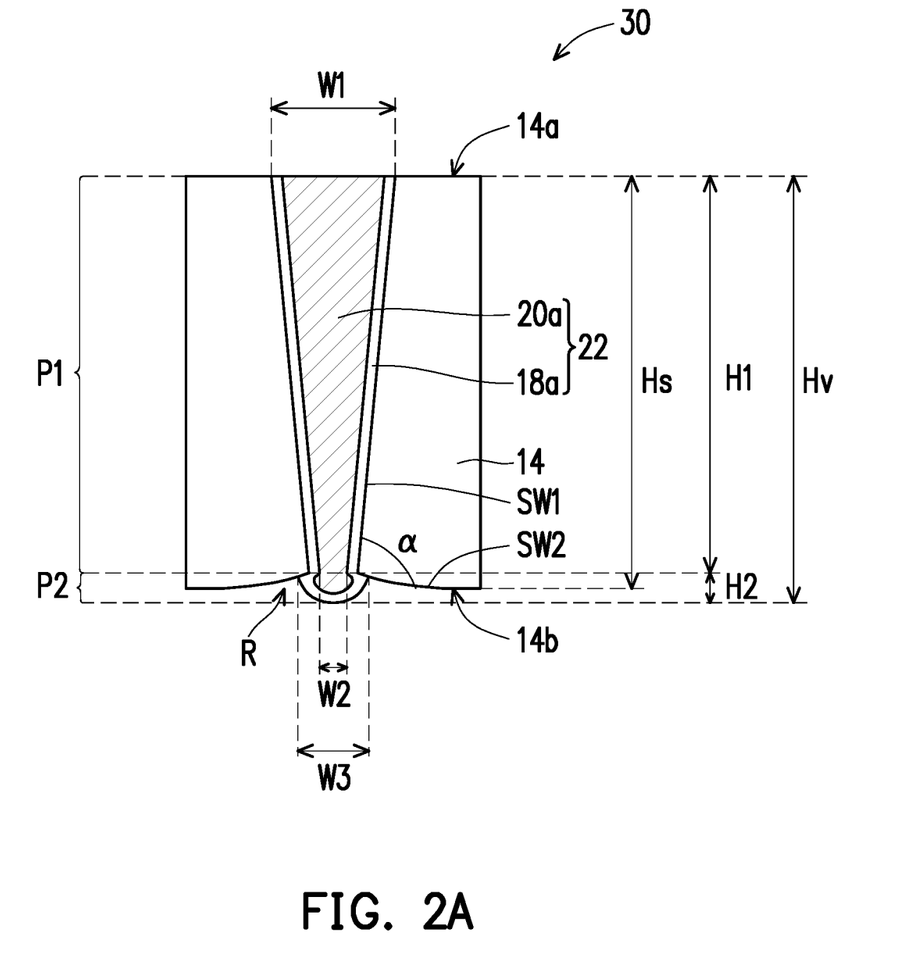
FIG. 2A and FIG. 2B are partial diagrams of the substrate having a through via in FIG. 1H.
Figure 2B:
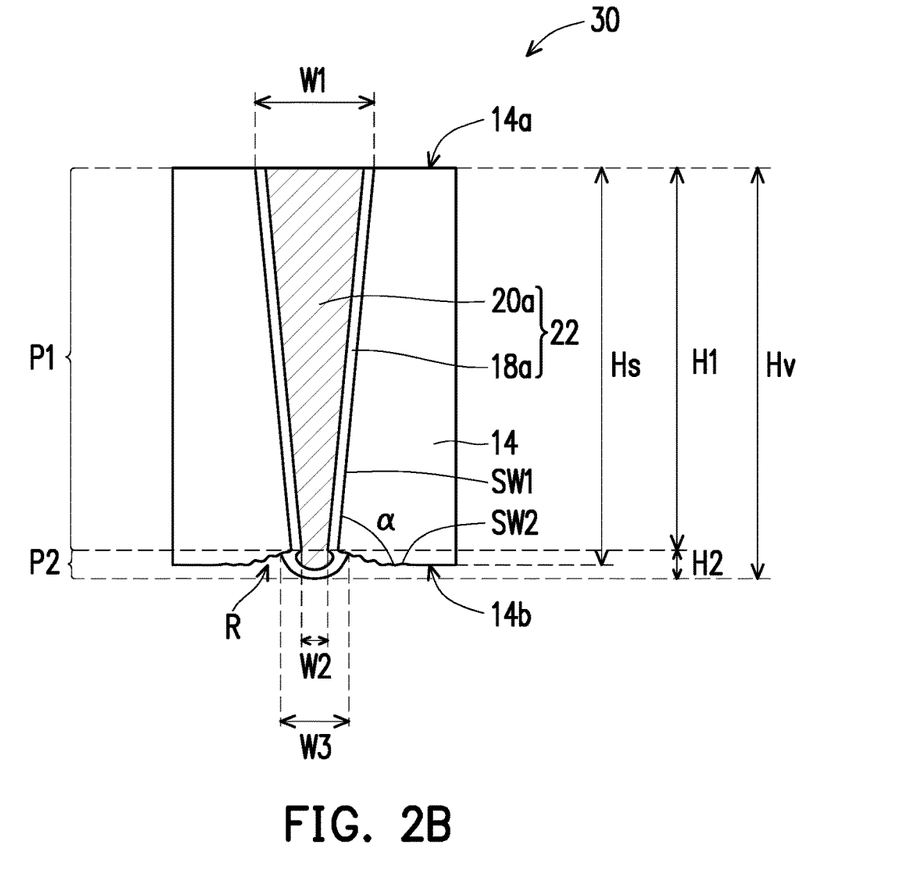

FIG. 2A and FIG. 2B are partial diagrams of the substrate 30 having a through via in FIG. 1H.

Referring to FIG. 2A and FIG. 2B, the substrate 30 having a through via includes the substrate 14 and the through via 22. In an embodiment where the substrate 14 is glass, the substrate 30 may also be referred to as a through glass via (TGV) functional substrate. The through via 22 includes the seed layer 18a and the conductive layer 20a. The seed layer 18a is located between the conductive layer 20a and the substrate 14 and covers the bottom portion of the conductive layer 20a. The through via 22 penetrates the upper surface 14a and the lower surface 14b of the substrate 14. In some embodiments, an upper surface 22a of the through via 22 and the upper surface 14a of the substrate 14 are coplanar, and a lower surface 22b of the through via 22 and the lower surface 14b of the substrate 14 are not coplanar.

The through via 22 may have inclined sidewalls or vertical sidewalls (not shown). A height Hv of the through via 22 is greater than the thickness Hs of the substrate 14. The difference between the height Hv of the through via 22 and the thickness Hs of the substrate 14 is smaller than the thickness of the release layer 12, for example, smaller than ½ the thickness of the release layer 12. In some embodiments, the difference between the height Hv of the through via 22 and the thickness Hs of the substrate 14 is between 1 μm to 10 μm. A top width W1 of the through via 22 is greater than a bottom width W3 of the through via 22, there is a middle width W2 between the top surface and the bottom surface of the through via 22, and the middle width W2 is smaller than the top width W1 of the through via 22 and smaller than the bottom width W3 of the through via 22. In some embodiments, the middle width W2 is the minimum width of the through via 22. The distance between the position of the minimum width of the through via 22 and the upper surface 14a of the substrate 14 is greater than the distance between the position of the minimum width of the through via 22 and the lower surface 14b of the substrate 14. The aspect ratio of the through via 22 is, for example, 2 to 10. The depth of the aspect ratio here refers to the depth (thickness) Hs of the substrate 14, and the width refers to the top width W1 of the through via. A sidewall inclination angle α of the through via 22 is between 80° and 88°, and the sidewall inclination angle α here is defined as follows:

$$\alpha = \tan^{-1}\left(\frac{W1 - W3}{2Hs}\right).$$

Moreover, the through via 22 may include a first portion P1 and a second portion P2. The first portion P1 of the through via 22 is embedded in the substrate 14. The width of the first portion P1 of the through via 22 is gradually decreased from the upper surface 14a of the substrate 14 toward the lower surface 14b of the substrate 14. In some embodiments, the width of the first portion P1 is gradually decreased from the top width W1 to the middle width W2. The difference between a height H1 of the first portion P1 and the height Hv of the through via 22 is between 1 μm and 10 μm. The sidewalls of the conductive layer 20a of the first portion P1 is covered by the seed layer 18a, and the top surface of the conductive layer 20a is exposed and not covered by the seed layer 18a and is coplanar with the top surface of the seed layer 18a.

The change in the width of the second portion P2 of the through via 22 is opposite to the change in the width of the first portion P1 of the through via 22. The second portion of the through via 22 is gradually decreased from the lower surface 14b of the substrate 14 toward the upper surface 14a of the substrate 14. In some embodiments, the width of the second portion P2 is gradually increased from the middle width W2 toward the lower surface 14b of the substrate 14 to the bottom width W3. The difference between a height H2 of the second portion P2 and the height Hv of the through via 22 is between 1 μm and 10 μm. The sidewalls and the bottom surface of the conductive layer 20a of the second portion P2 are covered by the seed layer 18a and are not exposed. A portion of the second portion P2 is embedded in the substrate 14, and another portion is slightly protruded beyond the lower surface 14b of the substrate 14. The bottom surface of the second portion P2 of the through via 22 is not a flat surface, but a curved surface.

Figure 2C:
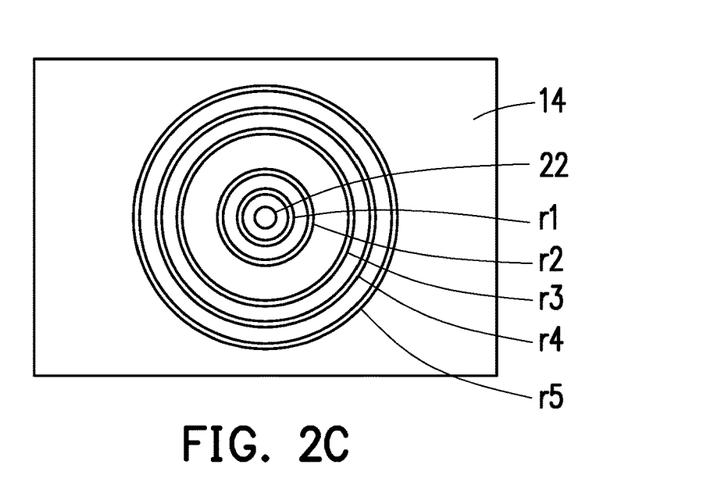
FIG. 2C is a bottom view of FIG. 2B.

As seen from the cross-sectional views of FIG. 2A and FIG. 2B, the substrate 14 for which the first portion P1 of the through via 22 is embedded has inclined sidewalls SW1. The substrate 14 for which the second portion P2 of the through via 22 is embedded has arc-shaped sidewalls SW2. A portion of the arc-shaped sidewalls SW2 of the substrate 14 is covered by the seed layer 18a, and a portion of the arc-shaped sidewalls SW2 of the substrate 14 is not covered by the seed layer 18a and is exposed. In other words, there is a notch R between the lower surface 14b of the substrate 14 and the bottom surface of the second portion P2 of the through via 22, and the notch R surrounds the second portion P2 of the through via 22, as shown in FIG. 2A. In an embodiment, the lower surface 14b of the substrate 14 may be a flat surface, as shown in FIG. 2A. In another embodiment, the lower surface 14b of the substrate 14 may be an uneven surface. The cross-sectional view thereof is shown in FIG. 2B, and the bottom view thereof is shown in FIG. 2C. Referring to FIG. 2C, the uneven lower surface 14b is a plurality of rings surrounding the through via 22, such as rings r1, r2, r3, r4, and r5. These rings r1 to r5 are caused by an etchant penetrating into the interface between the substrate 14 and the release layer 12 during the etching process of the enlargement and causing side etching. Therefore, these rings r1 to r5 are also called etched rings. In some embodiments, these etched rings are removed via a planarization process, such as a chemical mechanical polishing process, so that the substrate 14 has a flat bottom surface.

In addition, during the etching process of the enlargement, etching by-products (not shown), such as $CaF_2$, may also remain on the surface of the substrate 14. These etching by-products may be removed by acid, such as a 2.5 M hydrochloric acid (HCl) solution treatment and a chemical mechanical polishing process.

Figure 3A:
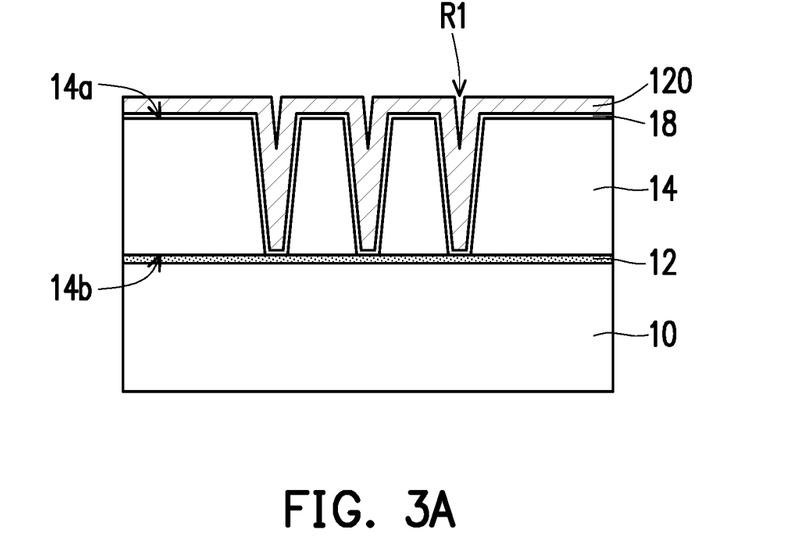
FIG. 3A to FIG. 3C are cross-sectional views of a manufacturing process of a substrate having a through via according to another embodiment of the disclosure.
Figure 3B:
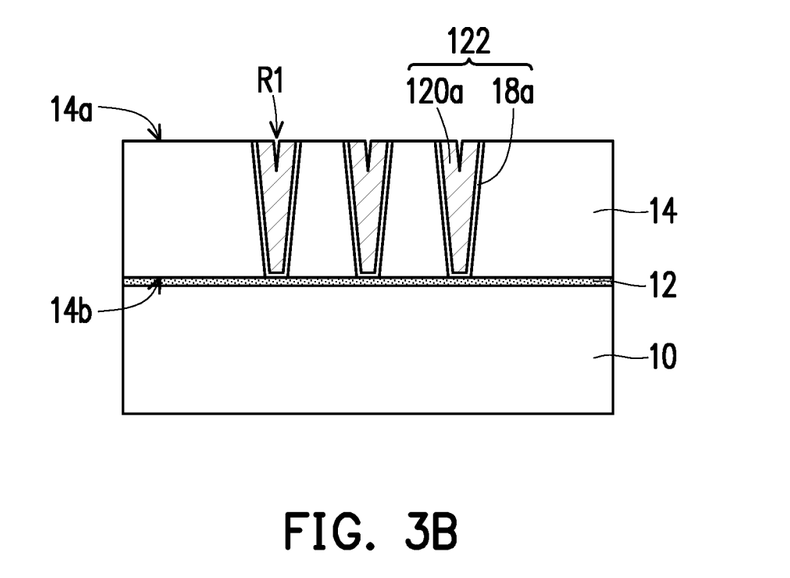

In the above embodiments, after the hole 16' is formed, the seed material layer 18 and the conductive material layer 20 together completely fill the hole 16'. In some other embodiments, the seed material layer 18 and a conductive material layer 120 partially fill the hole 16', but do not completely fill the hole 16', as shown in FIG. 3A. Next, the conductive material layer 120 and the seed material layer 18 on the upper surface 14a of the substrate 14 are removed according to the above method to form a conductive layer 120a and the seed layer 18a in the hole 16'. The conductive layer 120a and the seed layer 18a together form a through via 122, as shown in FIG. 3B. The surface of the through via 122 has a notch R1. Then, a releasing process is performed according to the above method to separate the substrate 30 having a through via from the carrier board 10 to form a substrate 130 having a through via, as shown in FIG. 3C.

Figure 3C:
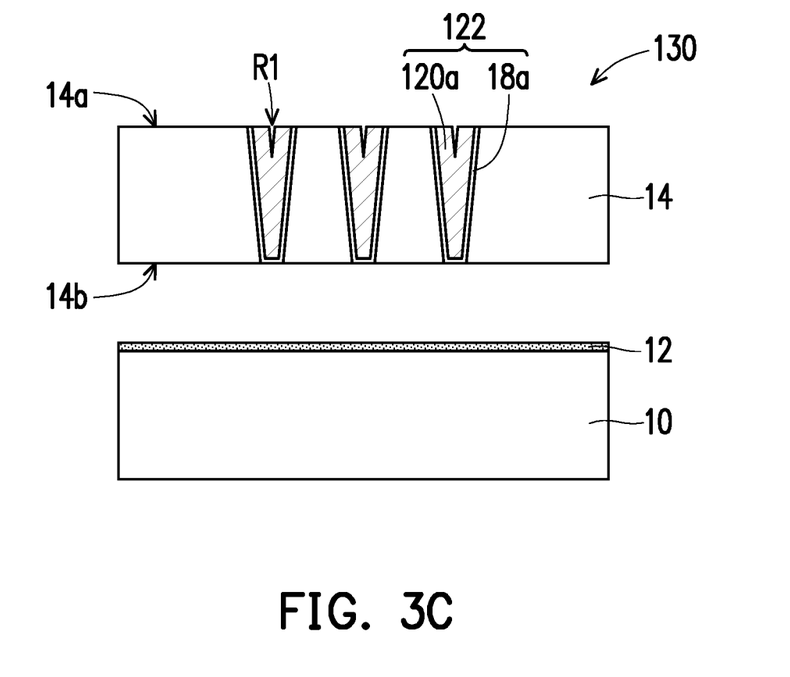
Figure 4A:
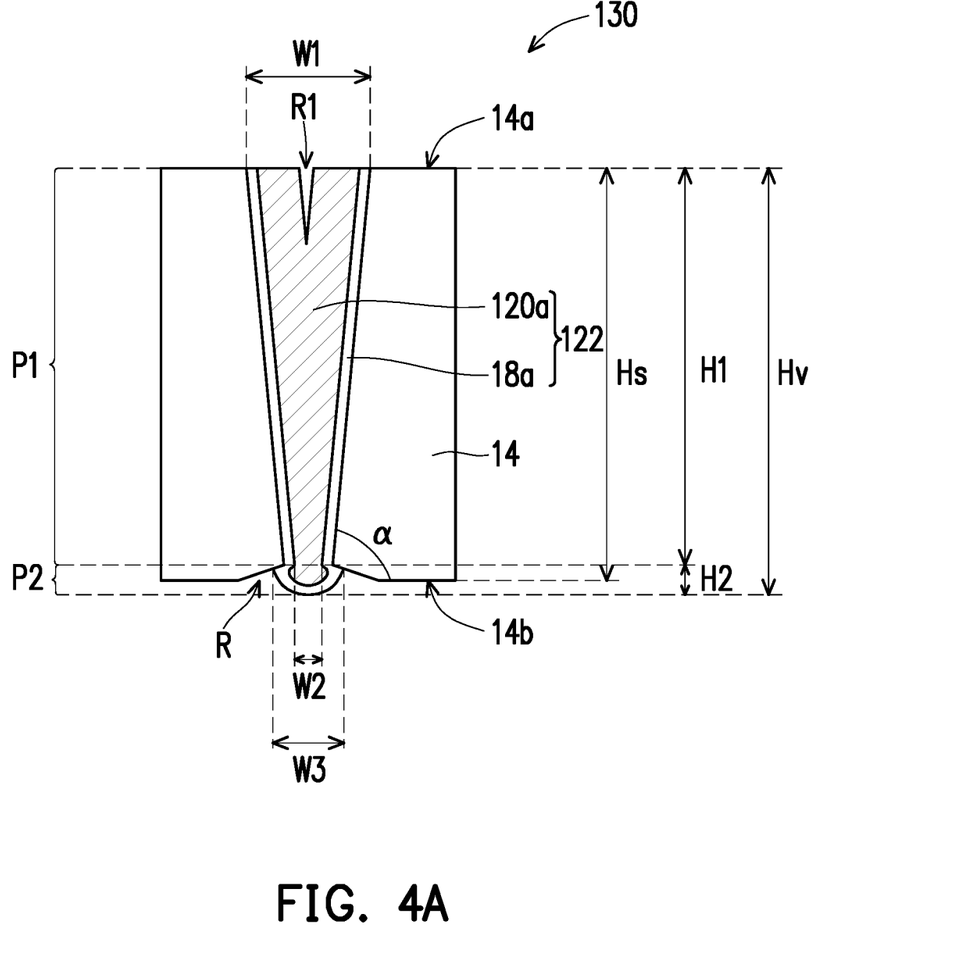
FIG. 4A and FIG. 4B are respectively partial diagrams of the substrate having a through via in FIG. 3C.
Figure 4B:
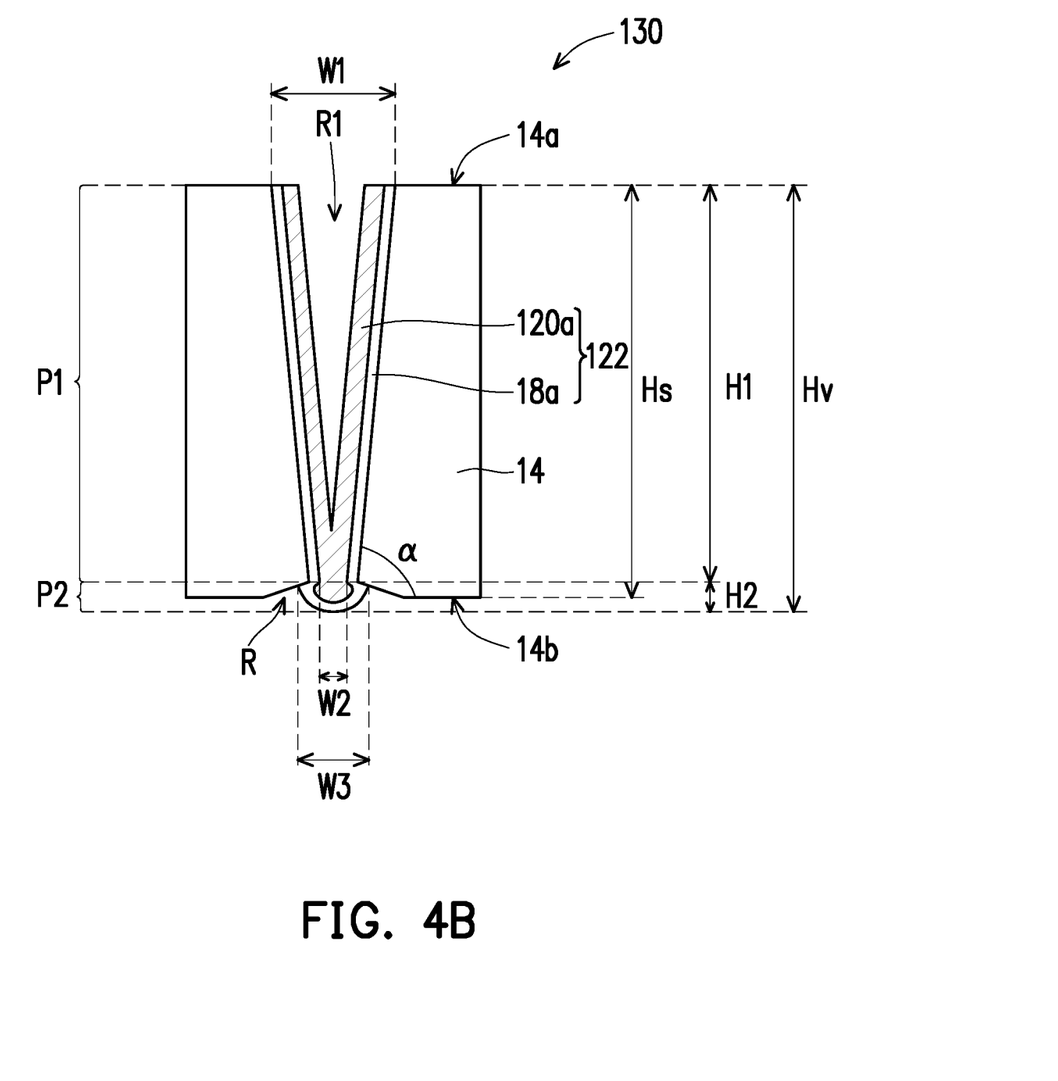

FIG. 4A and FIG. 4B are respectively partial diagrams of the substrate 130 having a through via in FIG. 3C.

Referring to FIG. 4A and FIG. 4B, the substrate 130 having a through via includes the substrate 14 and the through via 122. The through via 122 includes the conductive layer 120a and the seed layer 18a. The through via 122 is similar to the through via 22, and the difference is that the surface of the conductive layer 120a of the through via 122 also has the notch R1. When the thickness of the conductive layer 120a is greater, the width of the notch R1 is smaller and the depth thereof is smaller, as shown in FIG. 4A. When the thickness of the conductive layer 120a is smaller, the width of the notch R1 is greater and the depth thereof is greater, as shown in FIG. 4B. Based on the above, in the method of an embodiment of the disclosure, attaching and de-bonding (releasing) processes are performed on a thin substrate, and a through via is formed by drilling, enlargement, and metallization processes. The method of an embodiment of the disclosure does not need to polish the substrate, thus reducing the use of the chemical mechanical polishing process and reducing the risk of substrate cracking. Moreover, the process may be accelerated and material consumption caused by the chemical mechanical polishing process may be reduced, and therefore process cost may be reduced.

In the method of an embodiment of the disclosure, a suitable carrier board may be selected according to process requirements, and the carrier board may be reused. Moreover, if the method of an embodiment of the disclosure adopts a flexible carrier board, a roll-to-roll process may be implemented under the development of corresponding equipment.

Furthermore, the method of an embodiment of the disclosure does not have the issue of clogging, and the quality of the through via is good.

What is claimed is:

1. A substrate having a through via, comprising:
    a substrate; and
    a through via located in the substrate, wherein a height of the through via is greater than a thickness of the substrate, there is a minimum width between a top surface and a bottom surface of the through via, and a distance between a position of the minimum width and a first surface of the substrate is greater than a distance between the position of the minimum width and a second surface of the substrate, wherein the through via comprises:
    a first portion located in the substrate and extended from the first surface of the substrate toward the second surface of the substrate in a first direction, and a width of the first portion is gradually decreased along the first direction; and
    a second portion located in the substrate and connected to the first portion and extended along the first direction and protruded beyond the second surface of the substrate, wherein a width of the second portion is gradually decreased from the second surface of the substrate toward a second direction of the first surface of the substrate,
    wherein a width of a top surface of the first portion is greater than a width of a bottom surface of the second portion, and the bottom surface of the second portion of the through via has an arc surface.

2. The substrate having the through via of claim 1, wherein a difference between the height of the through via and a thickness of the substrate is between 1 μm and 10 μm.

3. The substrate having the through via of claim 1, wherein a difference between a height of the first portion and a height of the through via is between 1 μm and 10 μm.

4. The substrate having the through via of claim 1, wherein the top surface of the first portion of the through via is coplanar with the first surface of the substrate.

5. The substrate having the through via of claim 1, wherein the through via comprises:
    a conductive layer located in the substrate; and a seed layer covering sidewalls and a bottom portion of the conductive layer.

6. The substrate having the through via of claim 1, wherein the substrate comprises a glass substrate, a quartz substrate, a ceramic substrate, or a combination thereof.

7. The substrate having the through via of claim 2, wherein a surface of the through via has a notch.

8. A method of fabricating a substrate having a through via, comprising:
- providing a carrier board, wherein the carrier board has a release layer thereon;
- attaching the substrate onto the carrier board via the release layer;
- forming a first blind hole in the substrate via a light beam, wherein the first blind hole penetrates a first surface and a second surface of the substrate;
- performing an enlargement process on the first blind hole to form a second blind hole;
- forming a through via in the second blind hole; and
- performing a releasing process to release the substrate having the through via from the carrier board.

9. The method of fabricating the substrate having the through via of claim 8, wherein the light beam comprises infrared, visible, or ultraviolet laser.

10. The method of fabricating the substrate having the through via of claim 8, wherein the enlargement process comprises a wet etching process.

11. The method of fabricating the substrate having the through via of claim 8, wherein a method of forming the through via in the second blind hole comprises:
- forming a seed material layer on the first surface of the substrate and on sidewalls and a bottom surface of the second blind hole;
- forming a conductive material on the seed material layer; and
- removing the conductive material and the seed material layer on the first surface of the substrate.

12. The method of fabricating the substrate having the through via of claim 8, wherein the substrate comprises a glass substrate, a quartz substrate, a ceramic substrate, or a combination thereof.

* * * * *